United States Patent
Satou et al.

(10) Patent No.: US 9,705,505 B2
(45) Date of Patent: Jul. 11, 2017

(54) RECONFIGURABLE SEMICONDUCTOR DEVICE

(71) Applicant: Taiyo Yuden Co., Ltd., Tokyo (JP)

(72) Inventors: Masayuki Satou, Tokyo (JP); Isao Shimizu, Saitama (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/134,974

(22) Filed: Apr. 21, 2016

(65) Prior Publication Data

US 2017/0047931 A1 Feb. 16, 2017

(30) Foreign Application Priority Data

Aug. 11, 2015 (JP) .................................. 2015-158632

(51) Int. Cl.
*H01L 25/00* (2006.01)
*H03K 19/177* (2006.01)

(52) U.S. Cl.
CPC ..... *H03K 19/1774* (2013.01); *H03K 19/1776* (2013.01); *H03K 19/17728* (2013.01)

(58) Field of Classification Search
CPC ......... H03K 19/1776; H03K 19/17728; H03K 19/17736
USPC .... 326/40, 41, 46, 47; 365/189.011, 189.04, 365/230.05, 230.06
See application file for complete search history.

(56) References Cited

U.S. PATENT DOCUMENTS

2013/0100750 A1\* 4/2013 Ishiguro ............ H03K 19/1776
365/189.011
2015/0022232 A1 1/2015 Satou et al.

FOREIGN PATENT DOCUMENTS

JP 2013-219699 A 10/2013

\* cited by examiner

*Primary Examiner* — Daniel D Chang
(74) *Attorney, Agent, or Firm* — Chip Law Group

(57) ABSTRACT

There is provided a reconfigurable semiconductor device including a plurality of logic units connected to each other using an address line or a data line, each logic unit including a plurality of address lines, a plurality of data lines, a clock signal line configured to receive a system clock signal, a delay element configured to delay the system clock signal, a memory cell unit configured to operate in synchronization with a clock signal, and an address decoder configured to decode an address signal to output the decoded signal to the memory cell unit. The logic unit configuring a combination logic circuit operates in synchronization with a delayed clock signal outputted from the delay element.

16 Claims, 13 Drawing Sheets

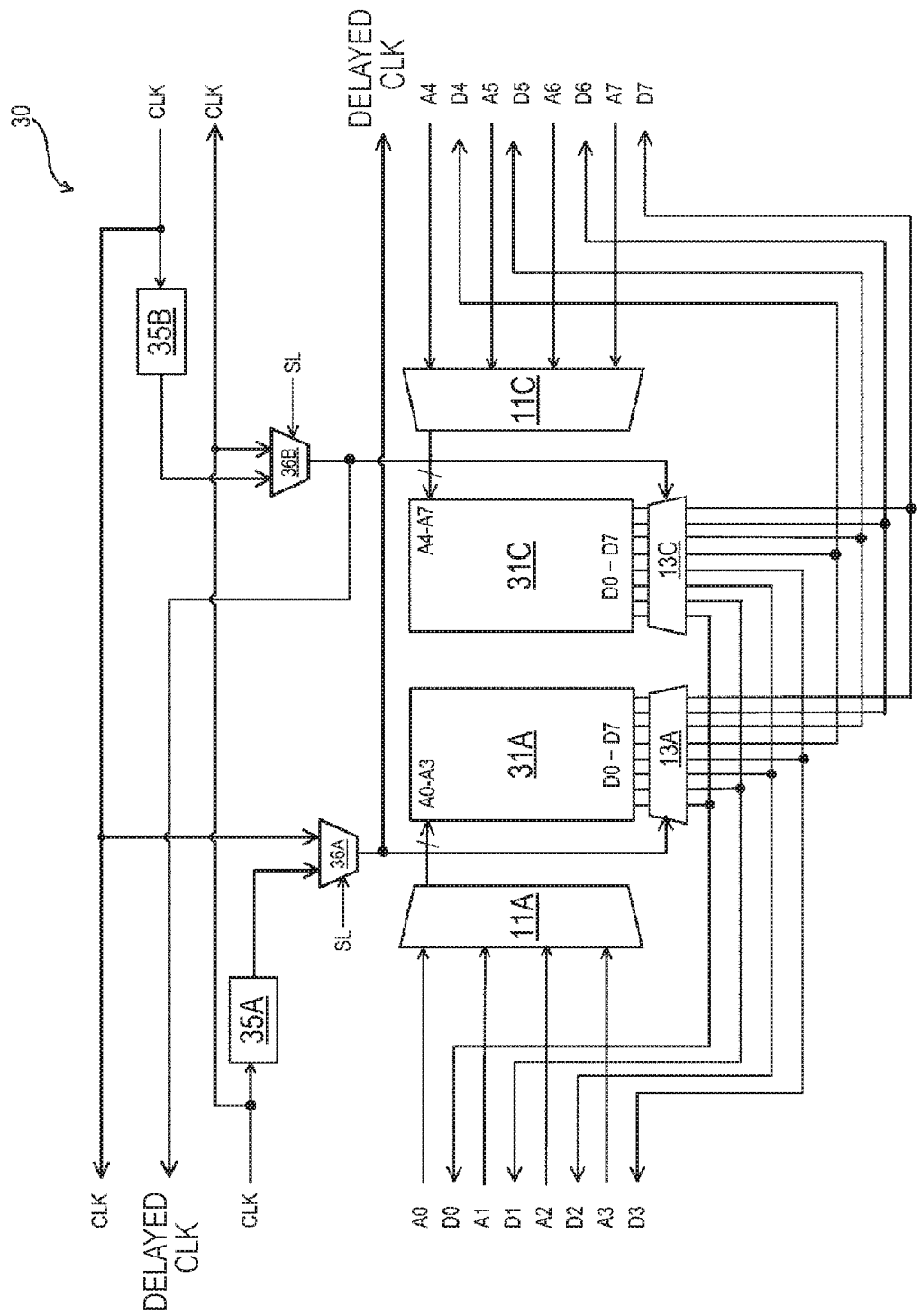

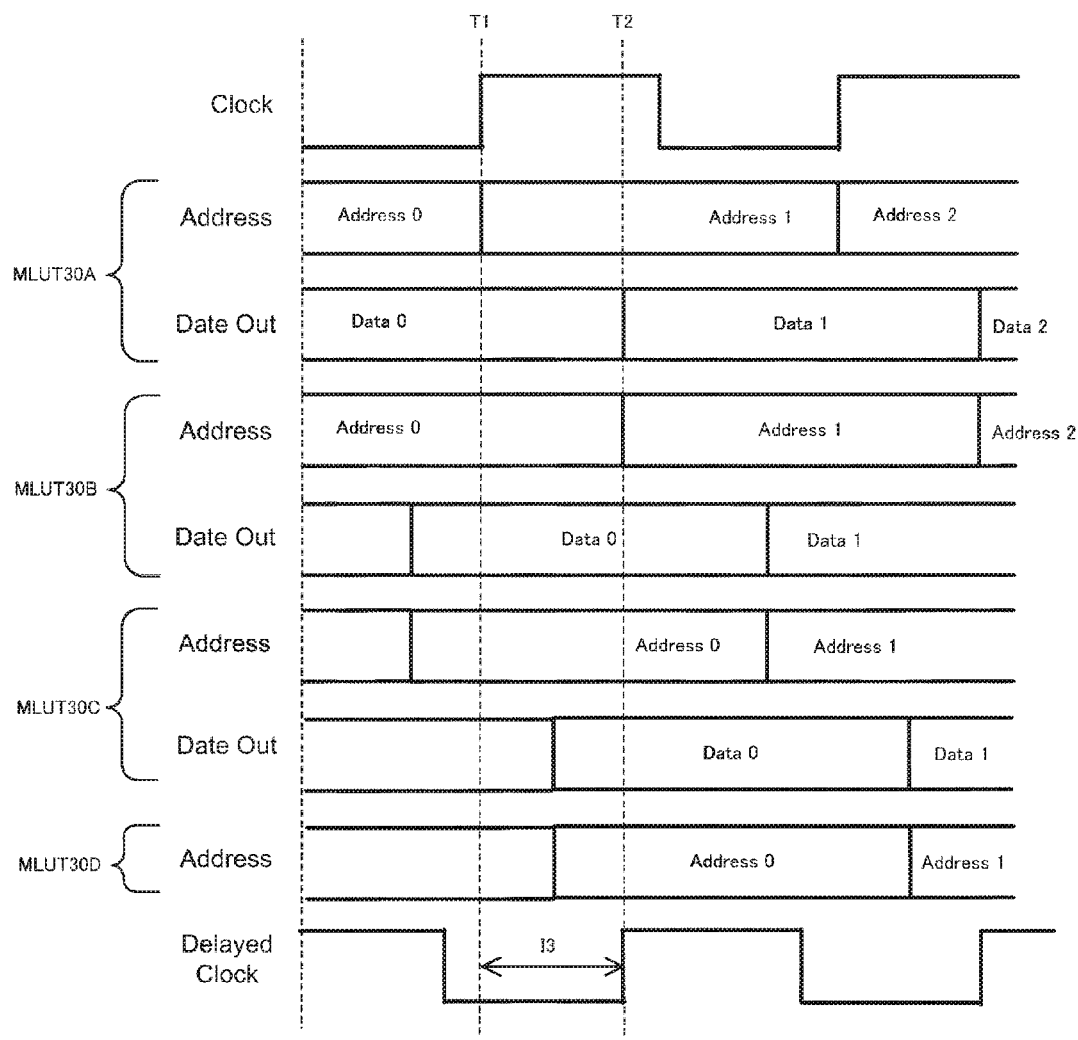

| A0 | A1 | A2 | A3 | D0 | D1 | D2 | D3 |
|----|----|----|----|----|----|----|----|
| 0 | 0 | 0 | 0 | 0 | * | * | * |
| 1 | 0 | 0 | 0 | 1 | * | * | * |
| 0 | 1 | 0 | 0 | 1 | * | * | * |
| 1 | 1 | 0 | 0 | 1 | * | * | * |
| 0 | 0 | 1 | 0 | 0 | * | * | * |
| 1 | 0 | 1 | 0 | 1 | * | * | * |
| 0 | 1 | 1 | 0 | 1 | * | * | * |
| 1 | 1 | 1 | 0 | 1 | * | * | * |
| 0 | 0 | 0 | 1 | 0 | * | * | * |
| 1 | 0 | 0 | 1 | 1 | * | * | * |
| 0 | 1 | 0 | 1 | 1 | * | * | * |
| 1 | 1 | 0 | 1 | 1 | * | * | * |
| 0 | 0 | 1 | 1 | 1 | * | * | * |
| 1 | 0 | 1 | 1 | 1 | * | * | * |
| 0 | 1 | 1 | 1 | 1 | * | * | * |
| 1 | 1 | 1 | 1 | 1 | * | * | * |

A0 ──────────────▶ D1
A1 ──────────────▶ D2
A2 ──────────────▶ D3
A3 ──────────────▶ D0

| A0 | A1 | A2 | A3 | D0 | D1 | D2 | D3 |
|----|----|----|----|----|----|----|----|
| 0 | 0 | 0 | 0 | 0 | 0 | 0 | 0 |
| 1 | 0 | 0 | 0 | 0 | 1 | 0 | 0 |
| 0 | 1 | 0 | 0 | 0 | 0 | 1 | 0 |
| 1 | 1 | 0 | 0 | 0 | 1 | 1 | 0 |
| 0 | 0 | 1 | 0 | 0 | 0 | 0 | 1 |
| 1 | 0 | 1 | 0 | 0 | 1 | 0 | 1 |
| 0 | 1 | 1 | 0 | 0 | 0 | 1 | 1 |
| 1 | 1 | 1 | 0 | 0 | 1 | 1 | 1 |
| 0 | 0 | 0 | 1 | 1 | 0 | 0 | 0 |
| 1 | 0 | 0 | 1 | 1 | 1 | 0 | 0 |
| 0 | 1 | 0 | 1 | 1 | 0 | 1 | 0 |
| 1 | 1 | 0 | 1 | 1 | 1 | 1 | 0 |
| 0 | 0 | 1 | 1 | 1 | 0 | 0 | 1 |
| 1 | 0 | 1 | 1 | 1 | 1 | 0 | 1 |
| 0 | 1 | 1 | 1 | 1 | 0 | 1 | 1 |
| 1 | 1 | 1 | 1 | 1 | 1 | 1 | 1 |

| A0 | A1 | A2 | A3 | D0 | D1 | D2 | D3 |
|----|----|----|----|----|----|----|----|
| 0 | 0 | 0 | 0 | 1 | * | 0 | * |
| 1 | 0 | 0 | 0 | 1 | * | 0 | * |
| 0 | 1 | 0 | 0 | 1 | * | 0 | * |
| 1 | 1 | 0 | 0 | 1 | * | 0 | * |
| 0 | 0 | 1 | 0 | 0 | * | 0 | * |
| 1 | 0 | 1 | 0 | 1 | * | 0 | * |
| 0 | 1 | 1 | 0 | 1 | * | 0 | * |
| 1 | 1 | 1 | 0 | 1 | * | 0 | * |
| 0 | 0 | 0 | 1 | 1 | * | 1 | * |
| 1 | 0 | 0 | 1 | 1 | * | 1 | * |
| 0 | 1 | 0 | 1 | 1 | * | 1 | * |
| 1 | 1 | 0 | 1 | 1 | * | 1 | * |
| 0 | 0 | 1 | 1 | 0 | * | 1 | * |
| 1 | 0 | 1 | 1 | 1 | * | 1 | * |
| 0 | 1 | 1 | 1 | 1 | * | 1 | * |
| 1 | 1 | 1 | 1 | 1 | * | 1 | * |

RECONFIGURABLE SEMICONDUCTOR DEVICE

CROSS REFERENCE TO RELATED APPLICATION(S)

This application is based upon and claims benefit of priority from Japanese Patent Application No. 2015-158632, filed on Aug. 11, 2015, the entire contents of which are incorporated herein by reference.

BACKGROUND

The present invention relates to a reconfigurable semiconductor device.

In contrast to a field programmable gate array (FPGA) having a dedicated switch circuit in each memory cell unit, a "memory-based programmable logic device (MPLD)" (registered trademark) has a memory cell unit and can be manufactured by a standard complementary metal oxide semiconductor (CMOS) logic process, thereby allowing a price reduction. Since the MPLD is not a synchronous type, however, it may be impossible to satisfy its performance when it is used as a synchronous memory. Thus, the applicant has proposed a "memory based reconfigurable logic device (MRLD)" (registered trademark) that can be manufactured by a standard manufacturing process of a memory cell unit and can be used as a synchronous memory (see JP 2013-219699A).

SUMMARY

As disclosed in JP 2013-219699A, a pair of memories configured by a synchronous memory being synchronous with a clock and an asynchronous memory being asynchronous with a clock is operated as a multi look up table (MLUT) capable of switching between synchronous and asynchronous operations. However, it is preferable to apply a synchronous memory in use of a standard process.

Wiring and a combination circuit configured by an FPGA may provide a large delay time in conjunction with a delay time of a look up table (LUT), and a wiring delay and capacitance of a switch. Similarly, wiring and a combination circuit configured by the MRLD may also provide a large delay time. This delay time may cause logical inconsistency in the LUT configuring the combination circuit when the MLUT being synchronous with a clock at the next stage starts calculation before the MLUT at the previous stage ends calculation.

In order to avoid such logical inconsistency, it may be necessary to perform simulation using computer aided design (CAD) or the like based on a predetermined system clock, provide a buffer circuit, and perform timing verification in which, for example, an output signal from a certain circuit is adjusted in timing to a delayed output signal from another circuit.

According to an embodiment solving the above-described issue, as shown in the following item sets, it is possible to provide a reconfigurable semiconductor device that may eliminate the need for timing verification by allowing a logic unit configuring a combination logic circuit to operate in synchronization with a delayed clock signal outputted from a delay element.

1. A reconfigurable semiconductor device including a plurality of logic units connected to each other using an address line or a data line, each logic unit including a plurality of address lines,
a plurality of data lines,
a clock signal line configured to receive a system clock signal,
a delay element configured to delay the system clock signal,
a memory cell unit configured to operate in synchronization with a clock signal, and
an address decoder configured to decode an address signal to output the decoded signal to the memory cell unit,
wherein the logic unit configuring a combination logic circuit operates in synchronization with a delayed clock signal outputted from the delay element.

The logic unit configuring the combination logic circuit may eliminate the need for timing verification unlike the FPGA by operating in synchronization with the delayed clock signal outputted from the delay element.

2. The reconfigurable semiconductor device according to item 1, further including a selection unit configured to select the delayed clock signal or the system clock signal,
wherein the logic unit configuring a synchronous circuit operates in synchronization with the system clock signal.

The logic unit configuring the synchronous circuit operates in synchronization with the system clock signal, thereby securing reconfigurability of the circuit.

3. The reconfigurable semiconductor device according to item 1,
wherein the logic unit further includes
a second memory cell unit configured to operate in synchronization with a clock signal, and
a second address decoder configured to decode an address signal to output the decoded signal to the second memory cell unit,
wherein the second memory cell unit operates in synchronization with the system clock signal,
wherein a data line connected to the memory cell unit and a data line connected to the second memory cell unit are connected to each other to output an OR, and
wherein, when some of the memory cell units are not used, all "0" is written to the unused memory cell unit.

The logic unit has the memory cell unit being synchronous with the delayed clock signal and the memory cell unit being synchronous with the system clock signal to operate one of them by using configuration data, thereby securing reconfigurability of the logic unit.

4. The reconfigurable semiconductor device according to item 3,
wherein the delayed clock signal is outputted to the logic unit at a previous stage and then to the logic unit at a next stage, and
wherein the system clock signal is outputted to the logic unit at the next stage and then to the logic unit at the previous stage.

The system clock signal is flown in a direction opposite to a direction of the delayed clock signal to alleviate signal delay of the system clock signal.

5. The reconfigurable semiconductor device according to any one of items 1 to 4, wherein the delay element is provided on the clock signal line for each two or more logic units, and a delay amount thereof is set as a fixed value.

A circuit scale of the delay element can be reduced.

6. The reconfigurable semiconductor device according to any one of items 3 to 5, further including:
third and fourth memory cell units configured to operate in synchronization with a clock signal;

a third address decoder configured to decode an address signal to output the decoded signal to the third memory cell unit; and a fourth address decoder configured to decode an address signal to output the decoded signal to the fourth memory cell unit, wherein the third memory cell unit operates in synchronization with the delayed clock signal, and the fourth memory cell unit operates in synchronization with the system clock signal, wherein the first and second address decoders decode an address inputted from one portion of the plurality of address lines, and wherein the third and fourth address decoders decode an address inputted from the other portion of the plurality of address lines.

7. The reconfigurable semiconductor device according to any one of items 1 to 6, wherein the memory cell unit stores truth table data configuring a wiring element and/or a logic element, and the logic unit operates as a multi look up table.

8. The reconfigurable semiconductor device according to any one of items 3 to 7, wherein truth table data configured not to create logical calculation across the first and third memory cell units as prohibition logic is stored.

9. A method for controlling a reconfigurable semiconductor device, wherein the reconfigurable semiconductor device includes a plurality of logic units connected to each other using an address line or a data line, each logic unit including
a plurality of address lines,
a plurality of data lines,
a clock signal line configured to receive a system clock signal,
a delay element configured to delay the system clock signal,
an address decoder, and
a memory cell unit having a plurality of memory cells and configured to operate in synchronization with a clock signal,
the method including operating, by the logic unit configuring a combination logic circuit, in synchronization with a delayed clock signal outputted from the delay element.

10. The method according to item 9,
wherein the reconfigurable semiconductor device further includes a selection unit configured to select the delayed clock signal or the system clock signal,
the method further including operating, by the logic unit configuring a synchronous circuit, in synchronization with the system clock signal.

11. The method according to item 9,
wherein the logic unit further includes
a second memory cell unit configured to operate in synchronization with a clock signal, and
a second address decoder configured to decode an address signal to output the decoded signal to the second memory cell unit,
the method further including:
operating, by the second memory cell unit, in synchronization with the system clock signal;
outputting an OR from a data line connected to the memory cell unit and a data line connected to the second memory cell unit being connected to each other; and
when some of the memory cell units are not used, writing all "0" to the unused memory cell unit.

12. The method according to item 11,
wherein the delayed clock signal is outputted to the logic unit at a previous stage and then to the logic unit at a next stage, and
wherein the system clock signal is outputted to the logic unit at the next stage and then to the logic unit at the previous stage.

13. The method according to any one of items 9 to 12, wherein the delay element is provided on the clock signal line for each two or more logic units, and a delay amount thereof is set as a fixed value.

14. The method according to any one of items 9 to 13, wherein the reconfigurable semiconductor device further includes
third and fourth memory cell units configured to operate in synchronization with a clock signal,
a third address decoder configured to decode an address signal to output the decoded signal to the third memory cell unit, and
a fourth address decoder configured to decode an address signal to output the decoded signal to the fourth memory cell unit,
the method further including:
operating, by the third memory cell unit, in synchronization with the delayed clock signal, and operating, by the fourth memory cell unit, in synchronization with the system clock signal;
decoding, by the first and second address decoders, an address inputted from one portion of the plurality of address lines; and
decoding, by the third and fourth address decoders, an address inputted from the other portion of the plurality of address lines.

15. The method according to any one of items 9 to 14, further including storing, by the memory cell unit, truth table data configuring a wiring element and/or a logic element, and operating as a multi look up table.

16. A program for controlling a reconfigurable semiconductor device,
wherein the reconfigurable semiconductor device includes a plurality of logic units connected to each other using an address line or a data line,
each logic unit including
a plurality of address lines,
a plurality of data lines,
a clock signal line configured to receive a system clock signal,
a delay element configured to delay the system clock signal,
a first address decoder configured to decode an address signal,
a second address decoder configured to decode an address signal,
a first memory cell unit having a plurality of memory cells and configured to operate in synchronization with a clock signal,
a second memory cell unit having a plurality of memory cells and configured to operate in synchronization with a clock signal,
the program executing the processing of:
decoding, by the first address decoder, the address signal to output the decoded signal to the first memory cell unit;
decoding, by the second address decoder, the address signal to output the decoded signal to the second memory cell unit;

operating, by the first memory cell unit, in synchronization with a delayed clock signal outputted from the delay element; and operating, by the second memory cell unit, in synchronization with the system clock signal.

According to an embodiment of the present invention, there is provided a reconfigurable semiconductor device that may eliminate the need for timing verification by allowing the logic unit configuring the combination logic circuit to operate in synchronization with the delayed clock signal outputted from the delay element.

BRIEF DESCRIPTION OF THE DRAWINGS

FIG. 4B is a diagram illustrating a first example of the MLUT capable of switching between synchronous and asynchronous operations;

FIG. 5 is a diagram illustrating a timing chart of a delay element;

DETAILED DESCRIPTION OF THE EMBODIMENT(S)

Figure 1:
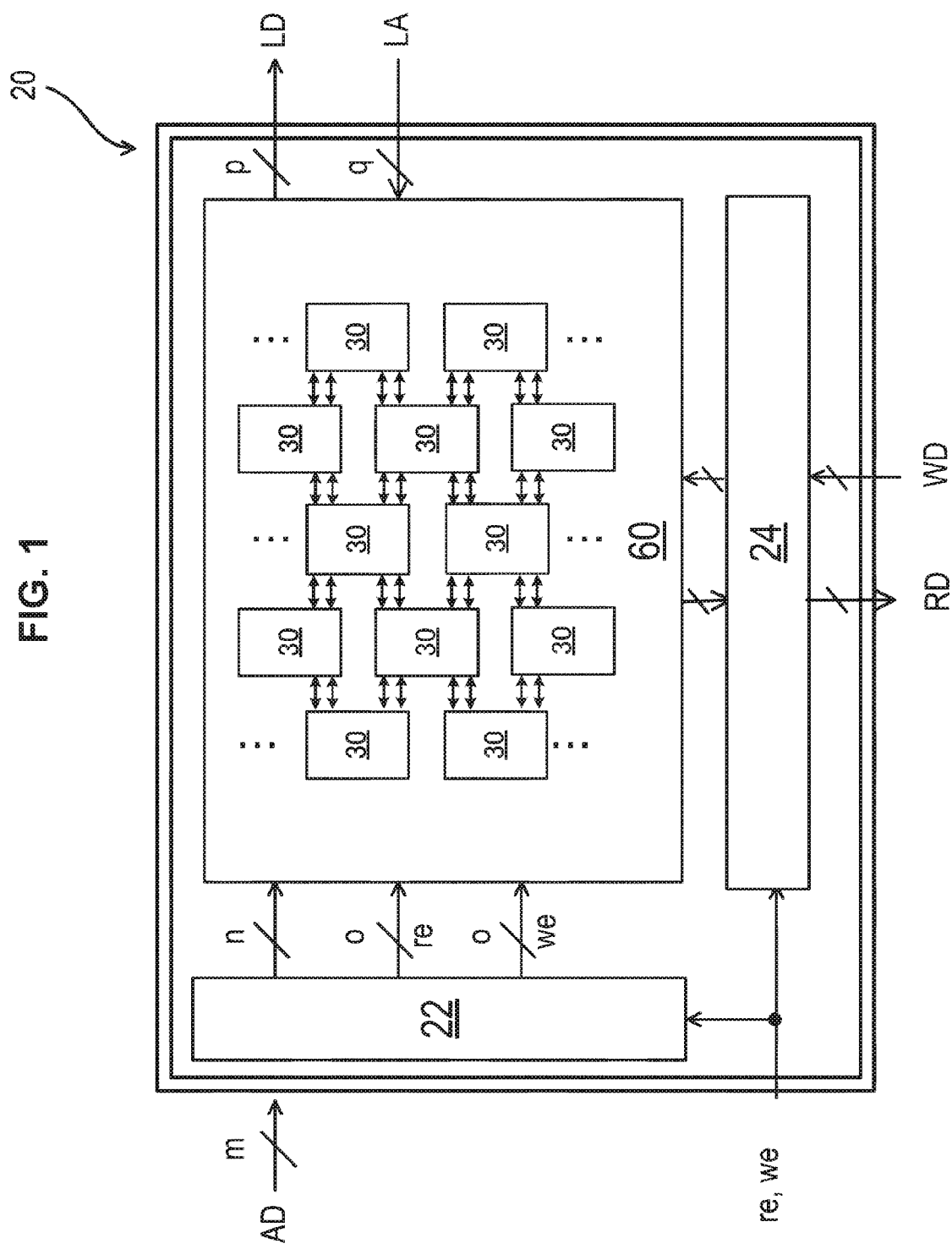
FIG. 1 is a diagram illustrating one example of an entire configuration of a semiconductor device according to an embodiment of the present invention.

Hereinafter, referring to the appended drawings, preferred embodiments of the present invention will be described in detail. It should be noted that, in this specification and the appended drawings, structural elements that have substantially the same function and structure are denoted with the same reference numerals, and repeated explanation thereof is omitted.

Hereinafter, with reference to the drawings, a reconfigurable semiconductor device will be discussed based on the following configuration.

1. MRLD
1.1. Entire Configuration of MRLD
1.2. MULT Arrangement
2. MLUT
2.1. Delay Element
2.2. Asynchronous Operation Using Delay Element
2.3. Output Buffer
2.4. Synchronous Operation Using Output Buffer
2.5. Truth Table Data for Second Example of MLUT Capable of Switching Between Synchronous and Asynchronous Operations
3. Logic, Connection and Synchronous Operation of MLUT
3.1. Truth Table Data Configuring Logic Circuit
3.2. Truth Table Data Configuring Connection Circuit
3.3. Truth Table Data Configuring Logic Circuit and Connection Circuit
3.4. Sequential Circuit Function
4. Method for Generating Truth Table Data
1. MRLD A reconfigurable logic device is referred to as an MRLD. The MRLD is similar to an MPLD, whose circuit is configured by a memory cell unit, in that MLUTs are directly connected without using a wiring element, but is distinguished from the MPLD in that a function of a synchronous memory cell unit supplied as a memory IP is effectively utilized.

Note that, in an embodiment of the present invention, a "memory unit" includes a decoder and an output buffer in a peripheral circuit, in addition to a memory cell unit composed of a plurality of memory cells.

1.1. Entire Configuration of MRLD

A reference numeral 20 shown in FIG. 1 represents an example of the MRLD. The MRLD 20 includes an MLUT array 60 formed by arranging in an array a plurality of MLUTs 30 utilizing the synchronous memory unit, and a row decoder 22 and a column decoder 24 specifying a memory reading and writing operation of the MLUTs 30.

The MLUT includes the synchronous memory units. Each storage element of the memory stores data considered as a truth table, so that the MLUT performs a logic operation as a logic element or a connection element, or a logic element and a connection element.

In the logic operation of the MRLD 20, signals of an address for logic LA and data for logic LD indicated by the solid line are used. The address for logic LA is used as an input signal of the logic circuit, and the data for logic LD is used as an output signal of the logic circuit. In the MLUT array 60, the address for logic LA and the data for logic LD are used as a signal line connecting between the MLUTs, and, for example, the address for logic LA of the MLUT is connected to a data line of the data for logic LD of the adjacent MLUT.

The logic realized by the logic operation of the MRLD 20 is realized by truth table data stored in the MLUT. Some MLUTs operate as a logic element as a combination circuit of an AND circuit, an adder and the like. The other MLUTs operate as a connection element for connecting between the MLUTs realizing the combination circuit. The truth table data is rewritten for allowing the MULTs to realize the logic element and the connection element by a writing operation to the memory.

The writing operation of the MRLD 20 is performed by an address for memory operation AD and data for writing WD, and the reading operation is performed by the address for memory operation AD and data for reading RD.

The address for memory operation AD is an address specifying a memory cell (to be described in FIG. 4A or others) within the MLUT, and is used in both of the reading operation and the writing operation of the memory. The addresses for memory operation AD are m signal lines and specify memory cells of 2 raised to the m-th power× n. The row decoder 22 receives the MLUT addresses through the m signal lines and decodes the MLUT addresses to identify the memory cells within the MLUT as a target of the memory operation. Note that as described later the address for logic LA is decoded by the decoder within the MLUT in an embodiment of the present invention.

The row decoder 22 decodes×bits of m bits of the addresses for memory operation AD according to a controls signal such as a read enable signal re and a write enable signal we to output the decoded addresses n to the MLUT 30. The decoded addresses n are used as addresses specifying the memory cells within the MLUT 30.

Similarly to the function of the row decoder 22, the column decoder 24 decodes y bits of m bits of the addresses for memory operation AD to output the decoded addresses n to the MLUT 30 and receives the output of the data for writing WD and the data for reading RD.

Note that, when the array of the MLUT has s rows and t columns, data of n×t bits is inputted from the MLUT array 60 to the column decoder 24. In order to select the MLUT for each row, the row decoder 22 outputs the re and we for o rows here. That is, the o rows correspond to s rows of the MLUT. When only one bit of the o bits is made active, the word line of the specific memory cells is selected. Then, in order to allow t pieces of the MLUTs to output data of n bits, data of n×t bits is selected from the MLUT array 60 and the column decoder 24 is used to select one column among the data.

1.2. MLUT Arrangement

Figure 2:
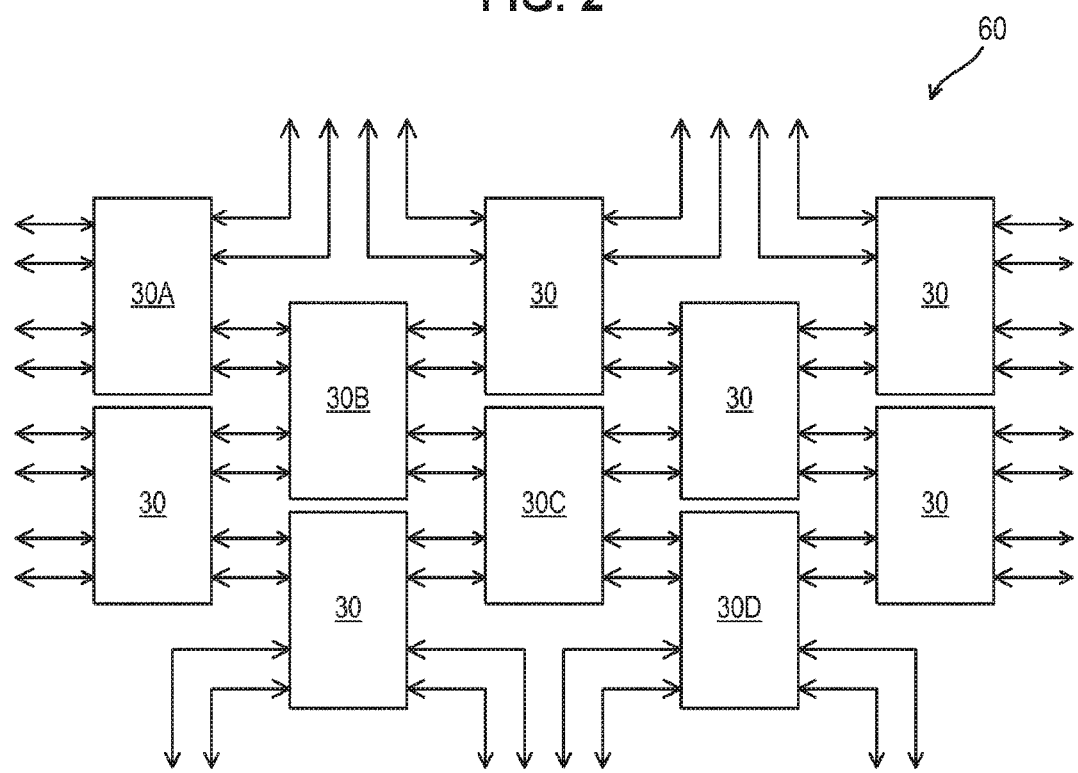
FIG. 2 is a diagram schematically illustrating an MLUT array configured by laterally stacking MLUTs.

FIG. 2 is a diagram schematically illustrating the MLUT array 60 configured by laterally stacking the MLUTs 30. The MLUT array 60 is configured by arranging the MLUTs 30 in an array as shown in FIG. 2. The memory used as the MLUT 30 has address lines equal in width to data lines. One bit of the address lines and one bit of the data lines are formed into a pair to define a pseudo bidirectional line. This pseudo bidirectional line is referred to as an "AD pair". In FIG. 2, an example of a data line width of 4 bits is illustrated. The use of the memory having the address line width of N bits and the data line width of N bits allows the MLUT having N pieces of the AD pairs to be realized.

Note that MLUTs 30A to 30D shown in FIG. 2 are also referred to in FIG. 5.

Figure 3:
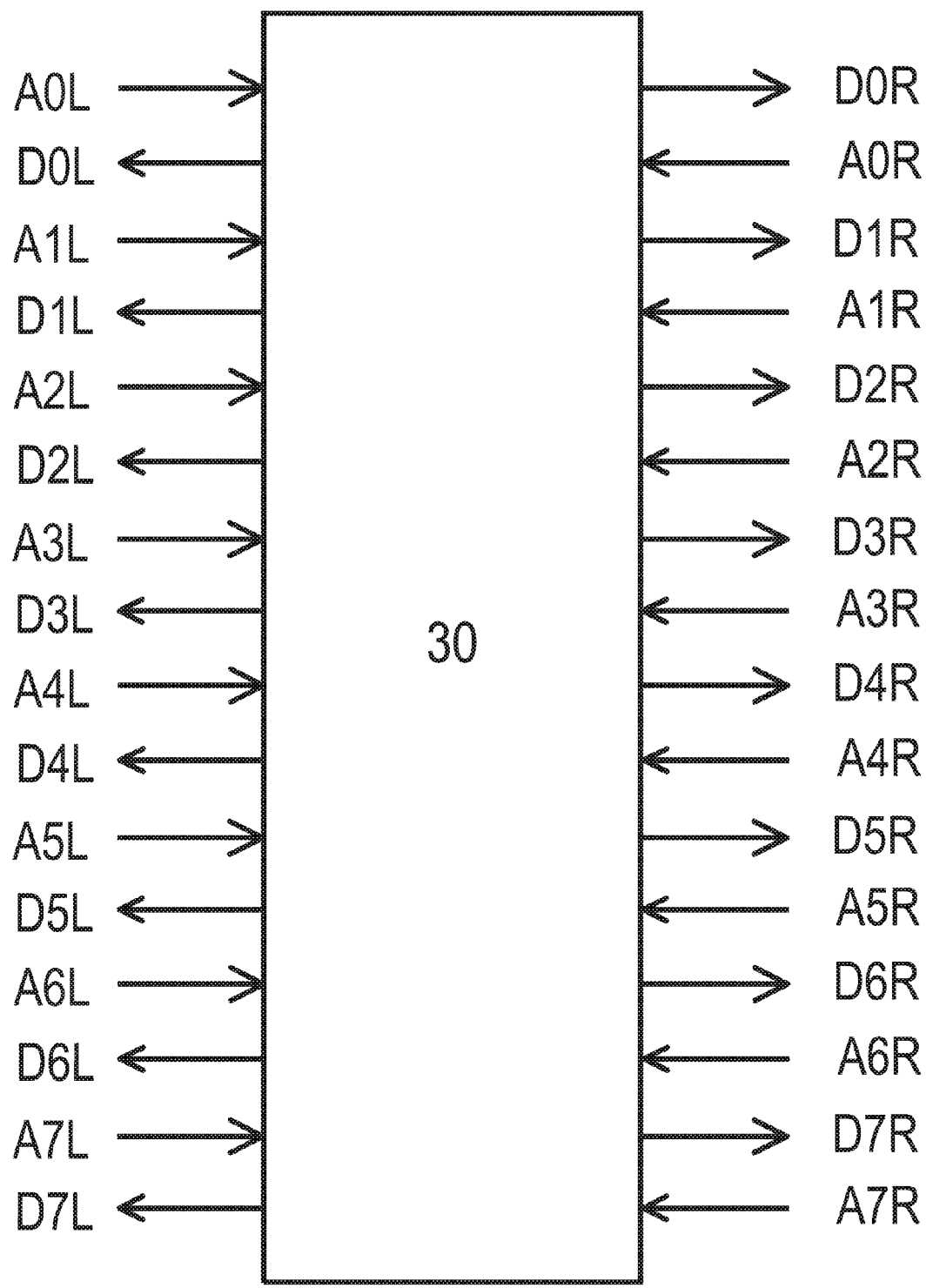
FIG. 3 is a diagram illustrating one example of the MLUT having a data line width of 8 bits.

FIG. 3 is a diagram illustrating one example of the MLUT having the data line width of 8 bits. The MLUT 30 shown in FIG. 2 has inputs of addresses A0L to A7L (as an example of the address for logic LA; the same shall apply hereinafter) from the left direction as shown in FIG. 3, and has inputs of addresses A0R to A7R from the right direction as shown in FIG. 3, and has outputs of data D0L to D7L (as an example of the data for logic LD; the same shall apply hereinafter) to the left direction as shown in FIG. 3, and has outputs of data D0R to D7R to the right direction as shown in FIG. 3. The MLUT with an n-value=8 will have 1M bits and will increase in size to be 4M bits equivalent to a configurable logic block (CLB) according to the known scheme. In contrast, the MLUT according to an embodiment of the present invention is configured by 4K bits (256 words×16 bits)×2.

Note that the n-value refers to the number of the address lines or data lines outputted from one side facing the adjacent MLUT 30. Since the 4-bit length type MLUT shown in FIG. 2 has a requirement of multiple bit transmission, the number of the address lines or data lines outputted from one side is "4" and the n-value is "4". As shown in FIG. 2, in the bidirectional type MLUT, the data transmission amount is half of the n-value in conjunction with the adjacent MLUT, and the number of stages obtained by dividing the signal path distance by (n-value/2) is needed to realize the longest signal path, since the signal path is shifted by one stage. Note that the "number of stages" represents the number of elements to be connected in the circuit. The "number of stages" of the MLUT also represents the number of the MLUTs to be connected similarly to the number of stages of a regular circuit. The number of logic stages of the MLUT is expressed by the following formula.

Number of Logic Stages of MLUT=$m/(n\text{-value}/2)$  Formula 1:

Here, m represents a signal path distance and indicates input signal lines for a logic cone. In the example shown in FIG. 2, the n-value is "4", and the (n-value/2) is "2" since the two adjacent MLUTs are located in one direction. When the number of the input data lines (m) for the logic cone is 8 as C-language logical calculation is conducted by 8 bits, the number of logic stages of the MLUT is "8/(4/2)=4". That is, when 8-bit calculation is conducted by the MLUT, the MLUTs configuring four stages may be needed. Note that, since the MLUT has a bidirectional property, folded-back wiring may reduce the number of stages.

In this manner, in the MRLD having the above-described MLUTs, data processing with a plurality of bits is performed for the adjacent MLUT, and a logic unit is configured by the plurality of memory cell units. Since the memory cell units are increased with the square of the number of address lines, if the address lines of each memory cell unit are reduced even with the number of the data lines being the same, the number of the totally necessary memory cells can be reduced.

One memory unit is connected to the data lines that output data in a first direction or a second direction opposite to the first direction with respect to the address inputs from the first direction, and the other memory unit is connected to the data lines that output data in a second direction or a first direction with respect to the address inputs from the second direction. The two memory units change the output direction of the data according to truth table data. In this manner, the output direction of the data can be limited to reduce the number of the necessary memory cells, while limiting reconfigurability of the logic unit.

2. MLUT

FIRST EXAMPLE

Figure 4A:
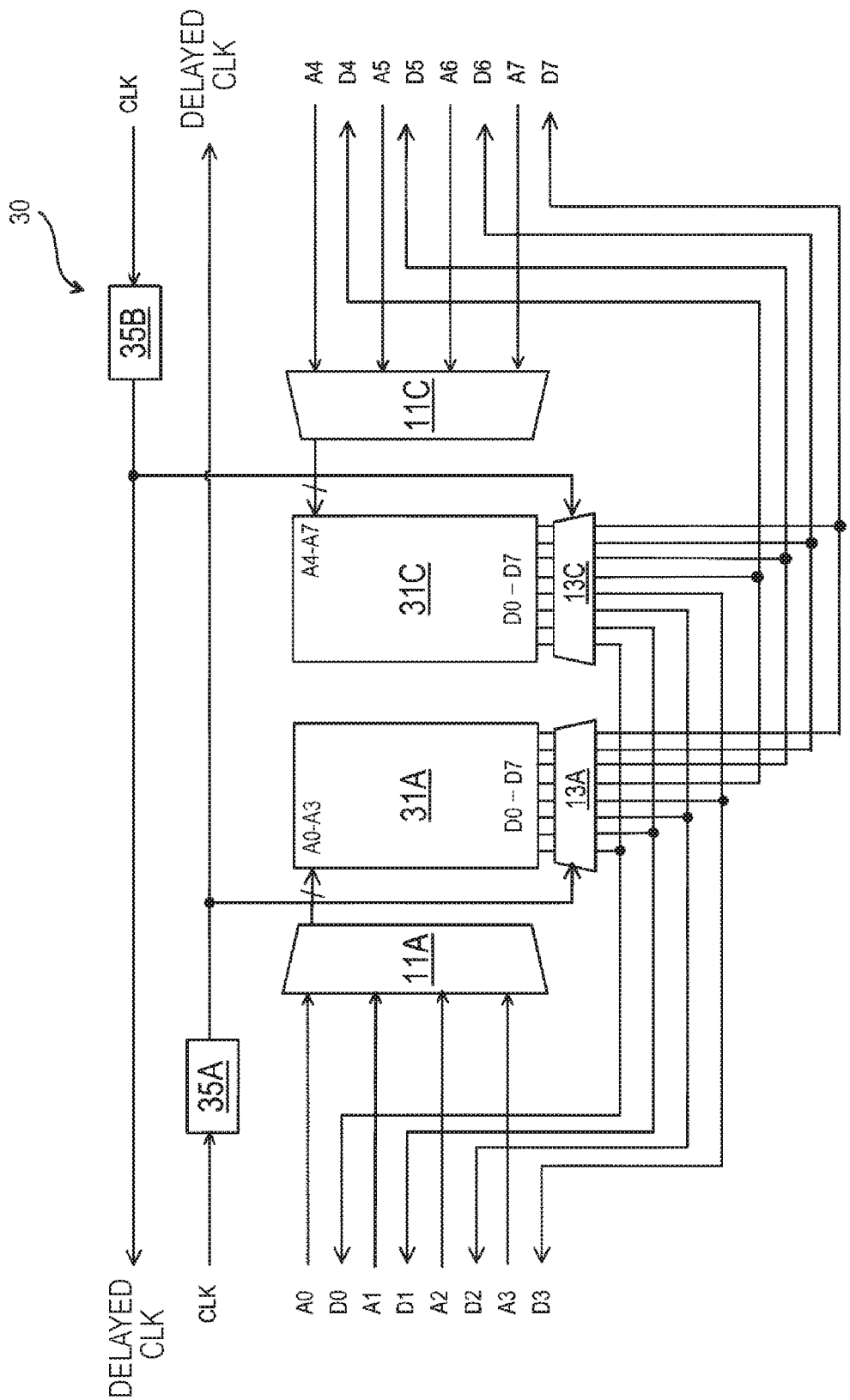
FIG. 4A is a diagram illustrating one example of the MLUT.

FIG. 4A is a diagram illustrating one example of a circuit diagram of the MLUT. The MLUT 30 has memory cell units 31A and 31C. Note that for explaining a logic operation of the MLUT, FIG. 4A illustrates addresses A0 to A7 (addresses for logic LA), and output data D0 to 7 (data for logic LD), but does not illustrate addresses for memory operation AD, data for writing WD, and data for reading RD. The same shall apply in FIG. 4B and FIG. 4C.

The MLUT 30 further includes address decoders 11A and 11C, output buffers 13A and 13C, and delay elements 35A and 35B. Note that it includes a selection circuit (not shown) for selecting the address for logic LA or the address for memory operation AD at the previous stage of the address decoders 11A and 11C. The output buffers 13A and 13C operate as a selection circuit for selecting the output data D0 to D7 or the data for reading RD, and also as a buffer for temporarily retaining the output data according to a clock (CLK).

2.1 Delay Element

The delay element is provided in a clock signal line of the asynchronous MLUT. The delay elements 35A and 35B are connected to a clock of the MLUT at the previous stage, and output the clock having a given delay time. The delay elements 35A and 35B is set with a delay amount in consideration of a data delay of the whole asynchronous MLUT. The delay element may be a delay element configured by a gate chain. The MLUT 30 is manufactured by using the synchronous memory unit and thereby operates in synchronization with a clock supplied from the outside.

2.2. Asynchronous Operation Using Delay Element

In the MRLD, similarly to other semiconductor devices, a delay time is generated in wring and circuit operation. For example, when the MLUT at the next stage starts calculation before the MLUT at the previous stage completes calculation, the logic circuit configured by the MLUTs may cause logical inconsistency.

FIG. 5 is a diagram illustrating a timing chart of the delay element. The MLUTs 30A to 30D shown in FIG. 5 are arranged similarly to the MLUTs 30A to 30D shown in FIG. 2. In this example, a circuit delay of a time (I3) between a time T1 and a time T2 is generated in the MLUTs 30A to 30D.

The delay time (I3) is generated from when the address signal is inputted to the MLUT to when data is outputted. When attention is payed to the time T1 when the clock signal is raised, the MLUT 30B uses data output (Data 0) from the MLUT 30A as address input (Address 0), causing no logical inconsistency. Further, the MLUT 30C uses data output (Data 0) from the MLUT 30B as address input (Address 0), causing no logical inconsistency.

However, since the MLUT 30D does not yet receive address input (Address 0) at the time T1, logical calculation is not yet performed by the same clock signal at this time point. Therefore, the delay element delays the time (I3) at each of the MLUTs 30A to 30D, allowing totally synchronized processing.

For the FPGA, since the number of necessary CLBs is not uniquely determined according to its circuit scale, clocking with a variable delay amount may be needed in consideration of logic time delay configured by the CLBs. However, for the MRLD, since the number of necessary MLUTs is determined by the number of signals as expressed by Formula 1 regardless of its circuit scale, it may be not necessary that the delay amount is addressed by alleviation in use of the buffer circuit, unlike asynchronous design in the FPGA, and the delay amount may be a fixed value for each MLUT.

As described above, the MRLD according to an embodiment of the present invention is provided with the delay element at the clock signal line so as to prevent logical inconsistency in the logic operation due to the delay. This allows the system clock to be delayed by the delay element so that the MLUT at the previous stage completes logical calculation and then transmits data to the MLUT at the next stage, thereby causing no logical inconsistency.

2.3. Output Buffer

The output buffers 13A and 13C (13A to 13D in a second example to be described later; the same shall apply hereinafter) read data from the data lines of the memory cell unit in synchronization with the clock, and retain the data, thereby providing a function of a flip-flop (FF). That is, a Q output of the FF is maintained at an I/O buffer, and the connection relationship with the logic circuit at the previous stage is realized using truth table data, so that the MLUT configured by the synchronous memory unit can provide the FF function. Note that the output buffers 13A and 13C include a sense amplifier for amplifying a voltage outputted from the bit line of the memory cell. Similarly the asynchronous MLUT receiving the clock outputted from the delay element has the I/O buffer. However, since the asynchronous MLUT is used for the combination logic circuit, it is used so as not to configure the FF. The synchronous operation will be discussed in "3. Logic, Connection and Synchronous Operation of MLUT".

2.4. Synchronous Operation Using Output Buffer

In the synchronous design, since the synchronous operation is achieved by a maximum clock time so that the delay time is included in a clock period in a comprehensive manner, and the circuit is configured within such timing restriction, the delay time of the wiring and the LUT appears to have no influence. This may produce a waiting time for synchronization with the clock in each logic unit (LU) configuring the FPGA, and each waiting time for synchronization is added in series as the whole FPGA, thereby reducing an operation speed of the FPGA.

In the synchronous design of the MRLD, a clock is inputted to the synchronous memory unit in a direction opposite to that of the asynchronous memory unit (referred to also as a back-forward) to avoid an erroneous operation due to wiring delay. A maximum time for accessing memory data, calculated by a specification of the memory IP, is set as the delay amount.

FIG. 4B is a diagram illustrating a first example of a circuit diagram of the MLUT capable of switching between synchronous and asynchronous operations. Since the MLUT 30 shown in FIG. 4B is different from the MLUT 30 shown in FIG. 4A in that it has selection units 36A and 36B, and the other configuration is the same, the description is omitted. The selection units 36A and 36B provide a function for switching between the synchronous operation and the asynchronous operation of the MLUT by selecting the delayed clock signal or the system clock signal.

In this manner, the MLUT located in the middle of the MLUT array 60 can select the delayed clock.

Figure 4C:
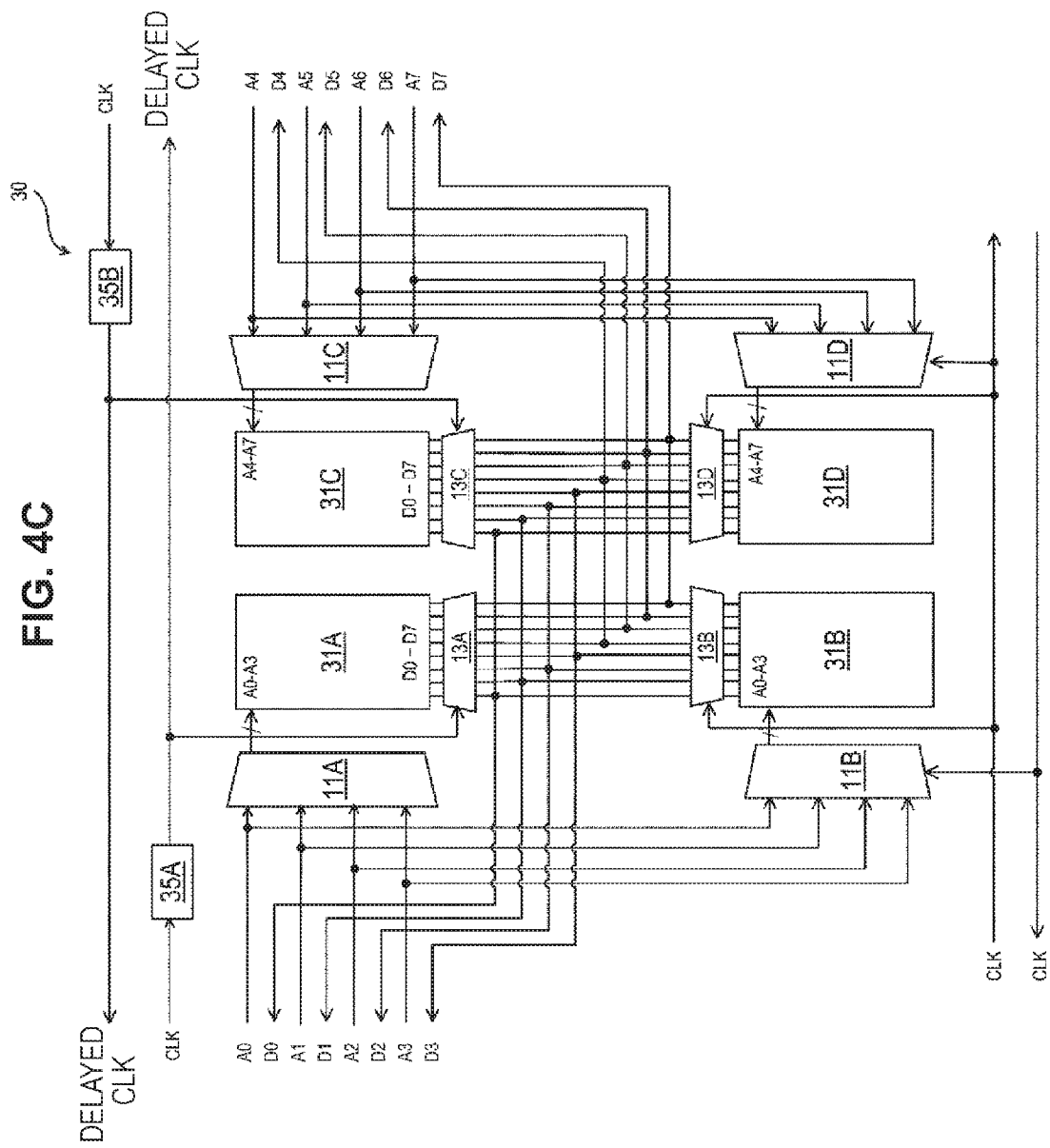
FIG. 4C is a diagram illustrating a second example of the MLUT capable of switching between synchronous and asynchronous operations.

FIG. 4C is a diagram illustrating a second example of a circuit diagram of the MLUT capable of switching between synchronous and asynchronous operations. The MLUT 30 includes memory cell units 31A to 31D, and the memory cell units 31A and 31C at the upper stage are memory cell units for asynchronous operation, and the memory cell units 31B and 31D at the lower stage are memory cell units for synchronous operation. The MLUT 30 shown in FIG. 4C is different from the MLUT 30 shown in FIG. 4A in that it has the memory cell units 31B and 31D, and the other configuration is the same.

The MLUT 30 further includes address decoders 11A to 11D, output buffers 13A to 13D, and delay elements 35A and 35B. The output buffers 13A and 13C operate in synchronization with the delayed clock delayed by the delay elements 35A and 35B. The output buffers 13B and 13D operate in synchronization with the clock (CLK) inputted in the back-forward. When the output buffers 13A to 13D operate in this manner, the memory cell units 31A and 31C at the upper stage operate in an asynchronous manner, and the memory cell units 31B and 31D at the lower stage operate in a synchronous manner.

While this arrangement increases the number of the memory cell units within the MLUT, the MLUT capable of switching between the synchronous operation and the asynchronous operation can be realized. However, as described below, the truth table data is different from that in the first example.

2.5. Truth Table Data for Second Example of MLUT Capable of Switching Between Synchronous and Asynchronous Operations The memory cell unit 31A (31B) includes a plurality of memory cells specified by addresses A0 to A3 from one side to output first output data D0 to D7 twice as many as the addresses A0 to A3, and the memory cell unit 31C (31D) includes a plurality of memory cells specified by addresses A4 to A7 from the other side to output second output data D0 to D7 twice as many as the addresses A4 to A7. Further, the MLUT 30 outputs one part of the first data and the second data to one side, and outputs the other part of the first data and the second data to the other side. Each memory cell unit stores the truth table data in the memory cells for each direction. Therefore, each of the memory cell units 31A and 31B stores the truth table data for the right-to-left direction and the truth table data for the left-to-right direction. That is, the MLUT stores the two truth table data each specifying the specific data output direction.

The MLUT according to an embodiment of the present invention is the bidirectional-arrangement MLUT, and includes the memory cell units 31B and 31D for synchronous operation, and the memory cell units 31A and 31C for asynchronous operation. The memory cell unit for synchronous operation or the memory cell unit for asynchronous operation forms a pair. In FIG. 4C, the memory cell units 31A and 31B (or 31C and 31D) that perform input/output operation for the adjacent MLUT 30 and operate as the logic element and/or the connection element are any one of the memory cell units at the upper stage or the lower stage. Therefore, data outputs of the memory cell units 31A and 31B (or 31C and 31D) are connected in a wired-OR connection or with an OR circuit, and the memory cell unit not being operated stores data of all "0".

Note that the data outputs of the memory cell units may be connected in the wired-OR connection as illustrated or may be connected by providing the OR logic circuit.

Further, as a characteristic of the bidirectional MLUT, there is a prohibition logic configuration. The necessity of the prohibition logic will be described using the two truth tables shown in Table 1.

TABLE 1

| Truth table 1 | | | | Truth table 2 | | | |
|---|---|---|---|---|---|---|---|
| Case | A0 | A1 | D0 | Case | A0 | A4 | D0 |
| a | 0 | 0 | 0 | a | 0 | 0 | 0 |
| b | 0 | 1 | 0 | b | 0 | 1 | 0 |
| c | 1 | 0 | 0 | c | 1 | 0 | 0 |
| d | 1 | 1 | 1 | d | 1 | 1 | 1 |

In the truth table 1, there is shown a truth table where A0 and A1 are used to configure an AND circuit and D0 is outputted. In the truth table 2, there is shown a truth table where A0 and A4 are used to configure an AND circuit and D0 is outputted. In the logic of the truth table 1, since the logical calculation is possible by using only the memory cell unit 31A using A3 to A0, if "0" is written to the other memory cell unit, an OR calculation prevents an effect from an output value of the other memory cell unit, causing no prohibition logic problem.

On the other hand, in the logic of the truth table 2, the memory cell unit using A3 to A0 cannot distinguish between c and d, and the memory cell unit using A7 to A4 cannot distinguish between b and d. In this manner, since the logical calculation across the two memory cell units cannot provide a correct value in the two truth tables, the logical calculation across the two memory cell units is defined as the prohibition logic. Therefore, in the logic configuration, it may be necessary to realize the logic within each memory cell unit. As a result, the truth table data according to an embodiment of the present invention is created so as to prevent the above-described prohibition logic. However, the logic prohibited can be realized in the other MLUTs.

Figure 6:
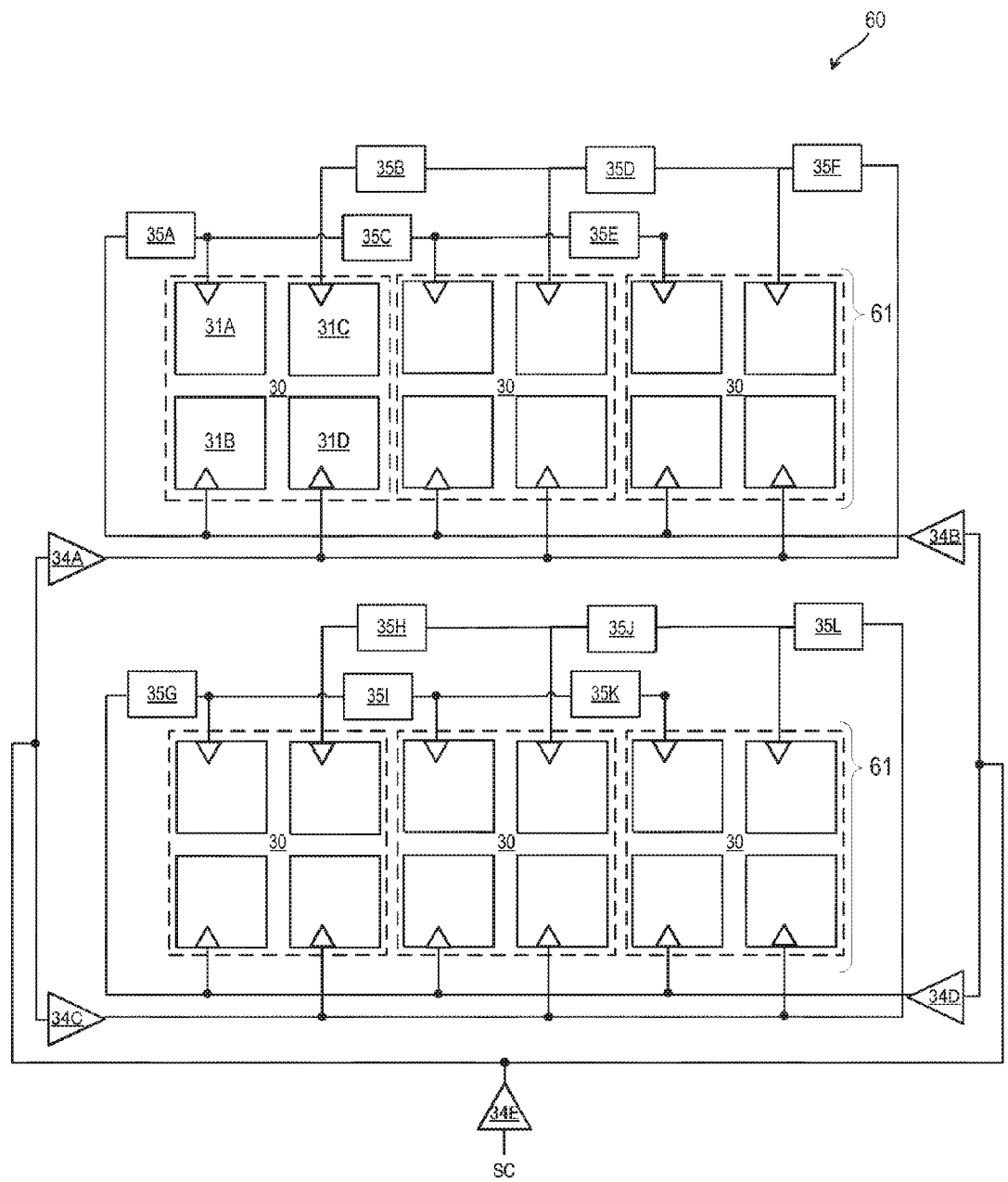
FIG. 6 is a diagram illustrating an arrangement of the delay element in an MRLD.

FIG. 6 is a diagram illustrating an arrangement of the delay element in the MRLD. In the MRLD shown in FIG. 6, the MLUT 30 shown in FIG. 4C configures an MLUT block 61 arranged by 2×3, and such configurations are provided in the upper line and the lower line. Note that the MLUT shown in FIG. 4C is used in FIG. 6, but the MLUT shown in FIG. 4A or FIG. 4B may be used. Clock trees are provided on both sides of the MLUT block 61 to correct a clock time between the upper line and the lower line. Buffer circuits 34A to 34E for maintaining a signal voltage are provided on a clock signal line. A main clock tree is configured to simultaneously clock the clock trees on both sides of the MLUT block 61. The memory unit for asynchronous operation (the memory cell units 31A and 31C, and the peripheral circuit thereof) uses as a clock a signal obtained by delaying clocks outputted from the clock trees on both sides by delay elements 35A to 35L.

Each of the delay elements 35A to 35L is arranged for each memory unit for asynchronous operation in order to obtain a predetermined delay amount. For example, the delay element 35A is provided for the memory cell unit 31A. Further, the clock signal is inputted to the memory unit for asynchronous operation in a feed-forward, and is inputted to the memory unit for synchronous operation in a back-forward opposite thereto. The feed-forward means clocking using a delayed clock delayed by the delay element, and refers to transmission of the clock in the same direction as the data output, from the left to the right (or the right to the left) in this example, in consideration of the delay amount of the MLUT. This allows a logic value of the MLUT to be fixed and then outputted for logic operation. This makes it possible to perform the combination circuit and the wiring operation.

In the back-forward, inversely, a logic value is outputted without being fixed and the logic value in such a state is fixed. Therefore, the clock is transmitted in the direction opposite to the data output direction, from the right to the left (or the left to the right) in this example, without being delayed. In other words, the clock is transmitted from the same direction as the flow of the address signal. Since this configuration may cause the wiring delay of the clock, the clock is transmitted in the direction opposite to the flow of the signal.

Figure 7:
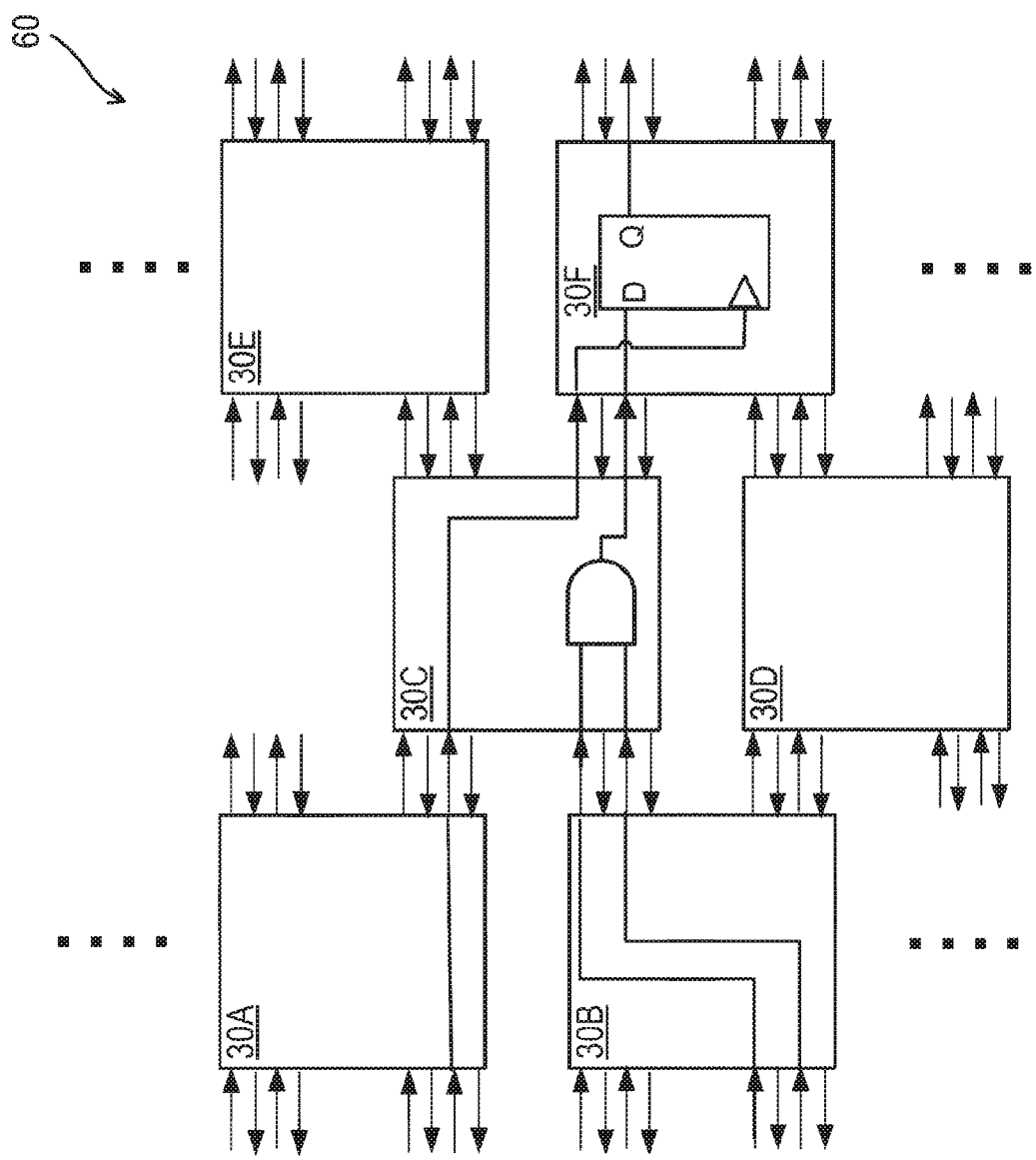
FIG. 7 is a diagram illustrating an example of the MLUT to which a synchronous circuit is applied.

FIG. 7 is a diagram illustrating an example of the MLUT array to which a synchronous circuit is applied. Note that the synchronous operation of the memory cell unit will be discussed in "3. Logic, Connection and Synchronous Operation of MLUT".

Note that it may be possible to use an address transition detector (ATD) circuit to provide the MLUT for asynchronous operation by generating a clock having a higher frequency than that of the system clock to operate at the high-frequency clock, and outputting bits to be stored in the output buffer in the absence of the address transition, or operating the decoder to rewrite the output buffer in the presence of the address transition. However, since the output may vary according to the ATD circuit to require provision of "operation prohibition time", and the circuit scale may be large compared with the signal delay element, which is not preferable in terms of the recent miniaturization of the circuit, the ATD circuit is not applied in this embodiment.

3. Logic, Connection and Synchronous Operation of MLUT

Hereinafter, the logic, connection and synchronous operation of the MLUT will be discussed using an example. Note that, although the MLUT 30 has eight addresses A0 to A7 and eight output data D0 to D7 in the above description, for convenience, the description will be provided with four addresses and four data.

Figure 8:
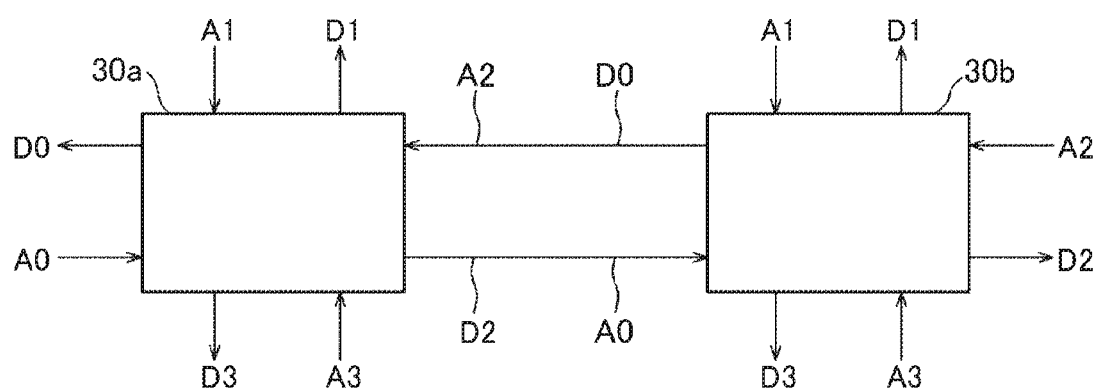
FIG. 8 is a diagram illustrating one example of the MLUT.

FIG. 8 is a diagram illustrating one example of the MLUT. The MLUTs 30a and 30b shown in FIG. 8 are connected to four addresses A0 to A3 and four output data D0 to D3. The address A2 of the MLUT 30a is connected to the output data D0 of the adjacent MLUT 30b, and the MLUT 30a receives data for logic outputted from the MLUT 30b as address inputs for logic. Further, the output data D2 of the MLUT 30a is connected to the address A0 of the MLUT 30b, and data for logic outputted by the MLUT 30a is received as address inputs for logic by the MLUT 30b. The configuration data (truth table data) for realizing the circuit configuration shown below with the MLUTs is used for the MLUT 30a or 30b shown in FIG. 8.

3-1. Truth Table Data Configuring Logic Circuit

Figure 9:
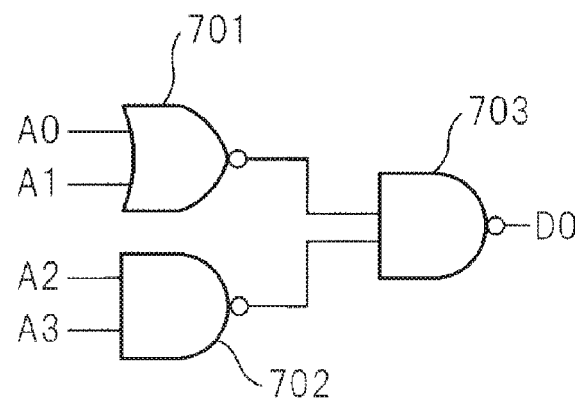
FIG. 9 is a diagram illustrating one example of the MLUT operating as a logic circuit.

FIG. 9 is a diagram illustrating one example of the MLUT operating as a logic circuit. In this example, addresses A0 and A1 are set as inputs to a two-input NOR circuit 701, and addresses A2 and A3 are set as inputs to a two-input NAND circuit 702. An output of the two-input NOR circuit 701 and an output of the two-input NAND circuit 702 are then inputted to a two-input NAND circuit 703, and an output of the two-input NAND circuit 703 is outputted to an output data D0. In this manner, a logic circuit is configured.

Figures 10, 11, 12:
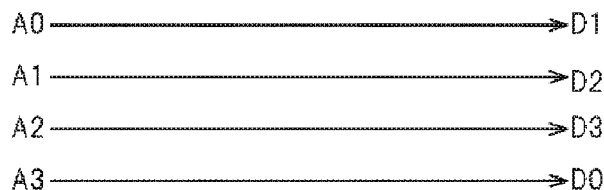
FIG. 10 is a diagram illustrating a truth table of the logic circuit shown in FIG. 9.
FIG. 11 is a diagram illustrating one example of the MLUT operating as a connection element.
FIG. 12 is a diagram illustrating a truth table of the connection element shown in FIG. 11.

FIG. 10 is a diagram illustrating a truth table of the logic circuit shown in FIG. 9. The logic circuit of FIG. 9 having four inputs uses all inputs of the inputs A0 to A3 as inputs. On the other hand, the logic circuit having only one output uses only the output D0 as an output. The "*" described in the columns of the outputs D1 to D3 in the truth table indicates that any value of "0" or "1" is possible to set. When the truth table data is actually written to the MLUT for reconfiguration, however, it is necessary to write any value of "0" or "1" to these columns.

3-2. Truth Table Data Configuring Connection Circuit

FIG. 11 is a diagram illustrating one example of the MLUT operating as a connection circuit. In FIG. 11, the MLUT as the connection circuit operates to output a signal of an address A0 to output data D1, output a signal of an address A1 to output data D2, and output a signal of an address A2 to output data D3. The MLUT as the connection circuit further operates to output a signal of an address A3 to output data D0.

FIG. 12 is a diagram illustrating a truth table of the connection circuit shown in FIG. 11. The connection circuit shown in FIG. 11 has four inputs and four outputs. Therefore, all inputs of the addresses A0 to A3 and all outputs of the output data D0 to D3 are used. According to the truth table shown in FIG. 12, the MLUT operates as the connection circuit to output the signal of the address A0 to the output data D1, output the signal of the address A1 to the output data D2, output the signal of the address A2 to the output data D3, and output the signal of the address A3 to the output data D0.

3.3. Truth Table Data Configuring Logic Circuit and Connection Circuit

Figures 13, 14:
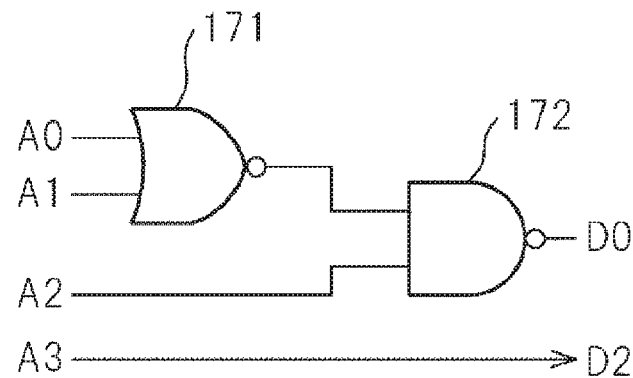
FIG. 13 is a diagram illustrating one example of one MLUT operating as the logic element and the connection element.
FIG. 14 is a diagram illustrating a truth table for the logic element and the connection element.

FIG. 13 is a diagram illustrating one example of one MLUT operating as the logic circuit and the connection circuit. In the example shown in FIG. 13, addresses A0 and A1 are set as inputs of a two-input NOR circuit 171, and an output of the two-input NOR circuit 171 and an address A2 are set as inputs of a two-input NAND circuit 172, and an output of the two-input NAND circuit 172 is outputted to output data D0. In this manner, a logic circuit is configured. At the same time, a connection circuit that outputs a signal of an address A3 to output data D2 is configured.

FIG. 14 is a diagram illustrating a truth table for the logic circuit and the connection circuit shown in FIG. 13. The logic circuit of FIG. 13 uses three inputs of the addresses A0 to A3 and uses the one output data D0 as an output. On the other hand, the connection circuit that outputs the signal of the address A3 to the output data D2 is configured.

3.4. Sequential Circuit Function

Unlike the combination circuit, the operation of a sequential circuit cannot be described by truth table data itself stored in the configuration memory. In an embodiment according to the present invention, the sequential circuit is realized by using a function of the output buffer 13. A D-type flip-flop configures the following truth table for an output of the memory cell unit being synchronously operated.

TABLE 2

| D (Output from configuration memory) | Clock | Q in next state |
|---|---|---|
| 0 | Rising | 0 |
| 1 | Rising | 1 |
| X | Falling | Retain Q in previous state |

4. Method for Generating Truth Table Data

The truth table data applied to the reconfigurable semiconductor device according to an embodiment of the present invention is generated by an information processing apparatus that executes a software program for logic configuration.

Figure 15:
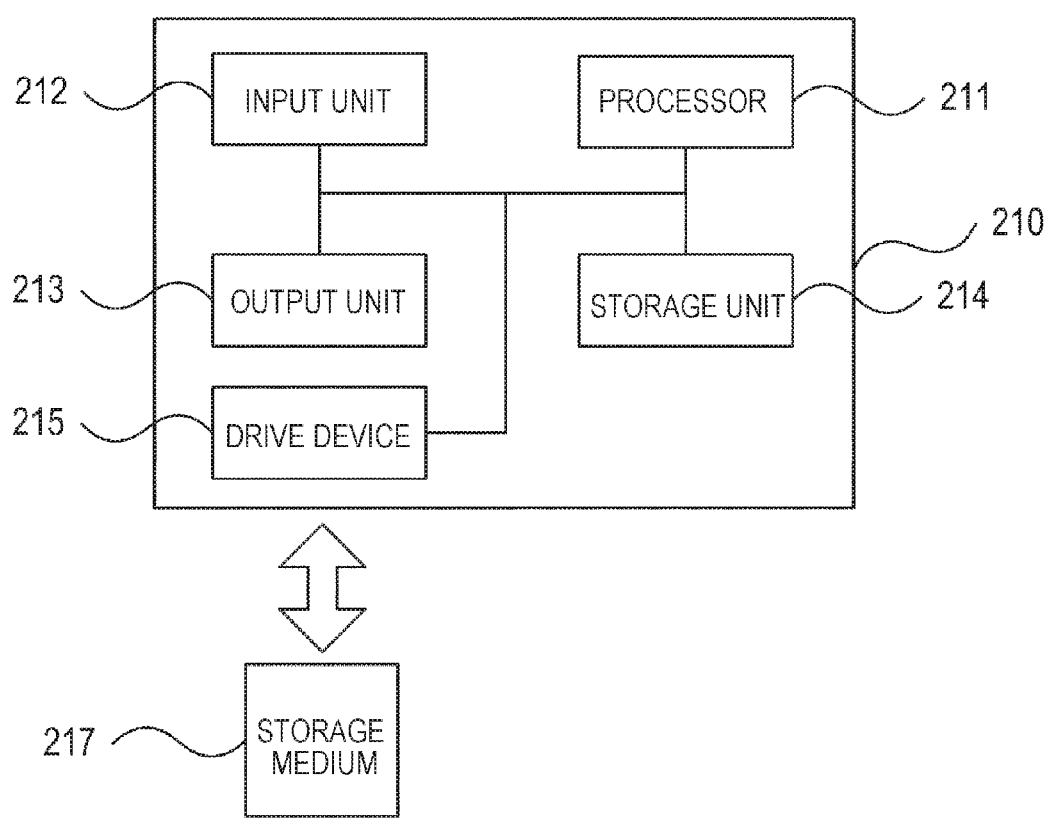
FIG. 15 is a diagram illustrating one example of a hardware configuration of an information processing apparatus.

FIG. 15 is a diagram illustrating one example of a hardware configuration of the information processing apparatus. An information processing apparatus 210 includes a processor 211, an input unit 212, an output unit 213, a storage unit 214, and a drive device 215. The processor 211 allows the storage unit 214 to store software for arrangement and wiring inputted to the input unit 212, a circuit description language such as a C-language description or a hardware description language (HDL) for designing an integrated circuit, and truth table data generated by executing the above-described software. Further, the processor 211 executes the software for arrangement and wiring to perform arrangement and wiring processing for the circuit description stored in the storage unit 214 and outputs the truth table data to the output unit 213. The MRLD 20 (not shown in FIG. 15) as a reconfigurable semiconductor device can be connected to the output unit 213, and the processor 211 executes logic configuration processing to write the generated truth table data to the MRLD 20 via the output unit 213. The output unit 213 may be connected to an external network. In this case, the software program for logic configuration is transmitted and received via the network. The drive device 215 is a device that reads and writes a storage medium 217 such as a digital versatile disc (DVD) and a flash memory. The drive device 215 includes a motor for rotating the storage medium 217, a head for reading and writing data on the storage medium 217, and the like. Note that the storage medium 217 may store the program for logic configuration or the truth tale data. The drive device 215 reads the program from the set storage medium 217. The processor 211 allows the storage unit 214 to store the program or truth table data read by the drive device 215.

When the truth table data is read into the MRLD 20, a specific mechanism operating in cooperation of the truth table data as a program and the hardware sources allows a function as the logic element and/or the connection element to be configured. Further, the truth table data can also be said to be data having a structure indicating a logic structure of the truth table.

The above-described embodiments are only typical examples, and the combination, modifications and variations of the components of the respective embodiments are apparent to those skilled in the art, and it should be understood by those skilled in the art that various changes and alterations may be made without departing from the spirit and scope of the appended claims. Specifically, in the logic or connection operation of the MRLD, it may be possible as the modifications of the embodiments to change the bidirectional MLUT operation to multidirectional MLUT operation.

What is claimed is:

1. A reconfigurable semiconductor device, comprising:
   a plurality of logic units connected to each other via an address line or a data line, wherein each of the plurality of logic units includes:
   a plurality of address lines;
   a plurality of data lines;
   a clock signal line configured to receive a system clock signal;
   a delay element configured to delay the system clock signal;
   a first memory cell unit configured to operate in synchronization with the system clock signal; and
   a first address decoder configured to decode a first address signal to output a first decoded signal to the first memory cell unit,
   wherein each of the plurality of logic units comprises a combination logic circuit configured to operate in synchronization with the delayed system clock signal output from the delay element.

2. The reconfigurable semiconductor device according to claim 1, further comprising a selection unit configured to select the delayed system clock signal or the system clock signal,
   wherein each of the plurality of logic units further comprises a synchronous circuit, and
   wherein each of the plurality of logic units is further configured to operate in synchronization with the system clock signal.

3. The reconfigurable semiconductor device according to claim 1,
   wherein each of the plurality of logic units further includes:
   a second memory cell unit configured to operate in synchronization with the system clock signal; and
   a second address decoder configured to decode a second address signal to output a second decoded signal to the second memory cell unit,
   wherein a first data line connected to the first memory cell unit is connected to a second data line connected to the second memory cell unit, and
   wherein, based on usage of the first memory cell unit or the second memory cell unit "0" is written to an unused memory cell unit.

4. The reconfigurable semiconductor device according to claim 3,
   wherein the delayed system clock signal is output to a first logic unit of the plurality of logic units at a previous stage and then to a second logic unit of the plurality of logic units at a next stage, and
   wherein the system clock signal is output to a third logic unit of the plurality of logic units at the next stage and then to a fourth logic unit of the plurality of logic units at the previous stage.

5. The reconfigurable semiconductor device according to claim 1, wherein the delay element is present on the clock signal line for each of two or more of the plurality of logic units, wherein a delay amount of the delay element is set as a fixed value.

6. The reconfigurable semiconductor device according to claim 3, further comprising:
   a third memory cell unit and a fourth memory cell unit;
   a third address decoder configured to decode a third address signal to output a third decoded signal to the third memory cell unit; and
   a fourth address decoder configured to decode a fourth address signal to output a fourth decoded signal to the fourth memory cell unit,
   wherein the third memory cell unit is configured to operate in synchronization with the delayed system clock signal, and the fourth memory cell unit is configured to operate in synchronization with the system clock signal,
   wherein the first address decoder and the second address decoder are further configured to decode a first address input from a first portion of the plurality of address lines, and
   wherein the third address decoder and the fourth address decoder are further configured to decode a second address input from a second portion of the plurality of address lines.

7. The reconfigurable semiconductor device according to claim 1, wherein the first memory cell unit is further configured to store truth table data for at least one of a wiring element or a logic element, wherein each of the plurality of logic units is further configured to operate as a multi look up table.

8. The reconfigurable semiconductor device according to claim 3, wherein truth table data that is configured to dissociate the first memory cell unit and a third memory cell unit is stored.

9. A method, comprising:
   in a reconfigurable semiconductor device that includes a plurality of logic units connected to each other via an address line or a data line, each of the plurality of logic units including:
   a plurality of address lines,
   a plurality of data lines,
   a clock signal line configured to receive a system clock signal,
   a delay element configured to delay the system clock signal,
   a first address decoder, and
   a first memory cell unit having a plurality of memory cells:
   operating the first memory cell unit in synchronization with the system clock signal; and
   operating, by each of the plurality of logic units comprising a combination logic circuit, in synchronization with the delayed system clock signal output from the delay element.

10. The method according to claim 9,
wherein the reconfigurable semiconductor device further includes a selection unit configured to select the delayed system clock signal or the system clock signal, and
the method further comprising operating, by each of the plurality of logic units that comprises a synchronous circuit, in synchronization with the system clock signal.

11. The method according to claim 9,
wherein each of the plurality of logic units further includes:
a second memory cell unit configured to operate in synchronization with the system clock signal, and
a second address decoder configured to decode a second address signal to output a second decoded signal to the second memory cell unit, the method further comprising:
operating, by the second memory cell unit, in synchronization with the system clock signal;
outputting an OR from a first data line connected to the first memory cell unit and a second data line connected to the second memory cell unit, wherein the first data line is connected to the second data line
wherein based on usage of the first memory cell unit or the second memory cell units, writing "0" to an unused memory cell unit.

12. The method according to claim 11,
wherein the delayed system clock signal is output to a first logic unit of the plurality of logic units at a previous stage and then to a second logic unit of the plurality of logic units at a next stage, and
wherein the system clock signal is output to a third logic unit of the plurality of logic units at the next stage and then to fourth logic unit of the plurality of logic units at the previous stage.

13. The method according to claim 9, wherein the delay element is present on the clock signal line for each of two or more of the plurality of logic units, wherein a delay amount of the delay element is set as a fixed value.

14. The method according to claim 11,
wherein the reconfigurable semiconductor device further includes:
a third memory cell unit and a fourth memory cell unit,
a third address decoder configured to decode a third address signal to output a third decoded signal to the third memory cell unit, and
a fourth address decoder configured to decode a fourth address signal to output a fourth decoded signal to the fourth memory cell unit, the method further comprising:
operating, by the third memory cell unit, in synchronization with the delayed system clock signal;
operating, by the fourth memory cell unit, in synchronization with the system clock signal;
decoding, by the first address decoder and the second address decoder, a first address input from a first portion of the plurality of address lines; and
decoding, by the third address decoder and the fourth address decoder, a second address input from a second portion of the plurality of address lines.

15. The method according to claim 9, further comprising storing, by the first memory cell unit, truth table data for at least one of a wiring element or a logic element, wherein each of the plurality of logic units is further configured to operate as a multi look up table.

16. A non-transitory computer-readable storage medium having stored thereon, computer-executable instructions for causing a reconfigurable semiconductor device to execute operations,
in the reconfigurable semiconductor device that includes a plurality of logic units connected to each other using an address line or a data line, each logic unit including:
a plurality of address lines,
a plurality of data lines,
a clock signal line configured to receive a system clock signal,
a delay element configured to delay the system clock signal,
a first address decoder configured to decode a first address signal,
a second address decoder configured to decode a second address signal,
a first memory cell unit having a first plurality of memory cells and configured to operate in synchronization with the delayed system clock signal,
a second memory cell unit having a second plurality of memory cells and configured to operate in synchronization with the system clock signal, the operations comprising:
decoding, by the first address decoder, the first address signal to output a first decoded signal to the first memory cell unit;
decoding, by the second address decoder, the second address signal to output a second decoded signal to the second memory cell unit;
operating the first memory cell unit in synchronization with the delayed system clock signal output from the delay element; and
operating the second memory cell unit in synchronization with the system clock signal.

* * * * *